(12) United States Patent
Li et al.

(10) Patent No.: US 12,402,476 B2
(45) Date of Patent: Aug. 26, 2025

(54) BACKPLANE, DISPLAY SUBSTRATE AND DISPLAY DEVICE

(71) Applicants: BEIJING BOE DISPLAY TECHNOLOGY CO., LTD., Beijing (CN); BOE TECHNOLOGY GROUP CO., LTD., Beijing (CN)

(72) Inventors: Jian Li, Beijing (CN); Zijian Wang, Beijing (CN); Chiachiang Lin, Beijing (CN); Ming Zhai, Beijing (CN); Pei Li, Beijing (CN); Zhiyuan Wang, Beijing (CN); Jinpeng Li, Beijing (CN); Pengjun Cao, Beijing (CN); Teng Zhang, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 733 days.

(21) Appl. No.: 17/041,844

(22) PCT Filed: Nov. 12, 2019

(86) PCT No.: PCT/CN2019/117510
§ 371 (c)(1),
(2) Date: Sep. 25, 2020

(87) PCT Pub. No.: WO2021/092757
PCT Pub. Date: May 20, 2021

(65) Prior Publication Data
US 2023/0095594 A1    Mar. 30, 2023

(51) Int. Cl.
*H10K 50/88* (2023.01)
*H01L 25/075* (2006.01)
*H10H 20/814* (2025.01)
*H10H 20/831* (2025.01)
*H10H 20/851* (2025.01)
*H10H 20/857* (2025.01)

(52) U.S. Cl.
CPC ......... *H10K 50/88* (2023.02); *H01L 25/0753* (2013.01); *H10H 20/814* (2025.01);
(Continued)

(58) Field of Classification Search
CPC .. H10K 50/88; H01L 25/0753; H10H 20/814; H10H 20/8312; H10H 20/8512; H10H 20/857; G09F 9/33
See application file for complete search history.

(56) References Cited

U.S. PATENT DOCUMENTS 9,755,110 B1 *  9/2017  Crowder ................. H01L 33/24
10,446,634 B2 *  10/2019  Qian ..................... H10K 77/111
(Continued)

FOREIGN PATENT DOCUMENTS

CN      101866910 A     10/2010
CN      105742307 A      7/2016
(Continued)

OTHER PUBLICATIONS

First Office Action issued on Oct. 18, 2022 for application No. CN201980002397.9 with English Translation attached.

*Primary Examiner* — Su C Kim
(74) *Attorney, Agent, or Firm* — Nath, Goldberg & Meyer; Joshua B. Goldberg

(57) ABSTRACT

The present disclosure provides a backplane, including: a transparent substrate; an electrode layer provided on a side of the transparent substrate and including a plurality of signal transmission lines; a plurality of micro-display light emitting devices provided on a side, facing away from the transparent substrate, of the electrode layer, electrically coupled to the signal transmission lines, and capable of emitting light towards the transparent substrate; a protective layer provided on a side, facing away from the transparent substrate, of the micro-display light emitting devices; and a
(Continued)

driving module provided on a side, facing away the transparent substrate, of the protective layer and electrically coupled to the signal transmission lines. The present disclosure also provides a display substrate and a display device.

20 Claims, 5 Drawing Sheets

(52) U.S. Cl.
CPC .... *H10H 20/8312* (2025.01); *H10H 20/8512* (2025.01); *H10H 20/857* (2025.01)

(56) References Cited

U.S. PATENT DOCUMENTS

| | | | |
|---|---|---|---|
| 2006/0094143 A1 | 5/2006 | Haluzak et al. | |
| 2011/0291143 A1* | 12/2011 | Kim | H01L 33/60 438/27 |
| 2014/0008691 A1* | 1/2014 | Tomoda | H01L 24/29 257/435 |
| 2014/0209945 A1* | 7/2014 | Baldridge | H01L 25/0753 257/91 |
| 2016/0043061 A1* | 2/2016 | Rhee | H01L 33/44 257/89 |
| 2017/0025399 A1 | 1/2017 | Takeya et al. | |
| 2017/0125647 A1* | 5/2017 | Park | H01L 33/505 |
| 2018/0190615 A1* | 7/2018 | Pan | G06F 3/044 |
| 2018/0358340 A1 | 12/2018 | Wong et al. | |
| 2019/0019816 A1* | 1/2019 | Kang | H01L 33/502 |

FOREIGN PATENT DOCUMENTS

| | | |
|---|---|---|
| CN | 107195654 A | 9/2017 |
| CN | 108054286 A | 5/2018 |
| CN | 109410775 A | 3/2019 |
| CN | 109920814 A | 6/2019 |
| CN | 111028697 A | 4/2020 |

* cited by examiner

BACKPLANE, DISPLAY SUBSTRATE AND DISPLAY DEVICE

This is a National Phase Application filed under 35 U.S.C. 371 as a national stage of PCT/CN2019/117510, filed Nov. 12, 2019 the content of which is hereby incorporated by reference in its entirety.

TECHNICAL FIELD

The present disclosure relates to the field of display, in particular to a backplane, a display substrate and a display device.

BACKGROUND

Micro-display light emitting devices (e.g., Micro-LEDs or Mini-LEDs) can be used for fabricating a display substrate, such as a micro light emitting diode display substrate. The existing fabrication process of the micro light emitting diode display substrate is too complex, and further popularization of the existing micro light emitting diode display substrate is influenced.

SUMMARY

The present disclosure provides a backplane, a display substrate and a display device.

In a first aspect, the present disclosure provides a backplane including: a transparent substrate; an electrode layer provided on a side of the transparent substrate and including a plurality of signal transmission lines; a plurality of micro-display light emitting devices provided on a side, facing away from the transparent substrate, of the electrode layer, electrically coupled to the signal transmission lines, and capable of emitting light towards the transparent substrate; a protective layer provided on a side, facing away from the transparent substrate, of the micro-display light emitting devices; and a driving module provided on a side, facing away from the transparent substrate, of the protective layer and electrically coupled to the signal transmission lines.

In some implementations, an opening is formed in an area of the electrode layer facing the micro-display light emitting devices in a direction perpendicular to the transparent substrate.

In some implementations, the backplane is divided into an active area and an edge area surrounding the active area; a part of the protective layer in the edge area is provided with a via hole communicated to the signal transmission lines, a connecting electrode is provided in the via hole, the connecting electrode extends to the side, facing away from the transparent substrate, of the protective layer, and the driving module is coupled to the signal transmission lines through the connecting electrode.

In some implementations, a hole filling adhesive is provided in the via hole and on a side of the connecting electrode facing away from the transparent substrate.

In some implementations, the backplane is divided into an active area and an edge area surrounding the active area; a part of the protective layer in the edge area covers a part, proximal to the active area, of the edge area, and the signal transmission lines are located in the edge area and a part of the signal transmission lines in the edge area and covered by the protective layer are coupled to the driving module.

In some implementations, a side surface, facing away from the active area, of the part of the protective layer in the edge area is a slope surface.

In some implementations, the electrode layer further includes a binding electrode coupled to the signal transmission lines, the binding electrode includes a first sub-electrode and a second sub-electrode, each of the micro-display light emitting devices includes a cathode and an anode, the first sub-electrode is coupled to one of the cathode and the anode, and the second sub-electrode is coupled to the other of the cathode and the anode.

In some implementations, the signal transmission lines include a first sub-signal line coupled to one of the cathode and the anode and a second sub-signal line coupled to the other of the cathode and the anode, In some implementations, all of the micro-display light emitting devices constitute a plurality of pixels, and each of the pixels includes at least three of the micro-display light emitting devices.

In some implementations, each of the pixels includes: a first micro-display light emitting device configured to emit red light; a second micro-display light emitting device configured to emit green light; and a third micro-display light emitting device configured to emit blue light.

In some implementations, each of the pixels includes: a first micro-display light emitting device configured to emit a predetermined color light, a first light conversion material being formed in the opening between the first micro-display light emitting device and the transparent substrate; a second micro-display light emitting device configured to emit the predetermined color light, a second light conversion material being formed in the opening between the second micro-display light emitting device and the transparent substrate; a third micro-display light emitting device configured to emit the predetermined color light; the first light conversion material is configured to convert the predetermined color light into a first color light, and the second light conversion material is configured to convert the predetermined color light into a second color light.

In some implementations, the predetermined color light is blue light, the first color light is red light, and the second color light is green light.

In some implementations, the first light conversion material includes red fluorescent adhesive; the second light conversion material includes green fluorescent adhesive.

In some implementations, the micro-display light emitting devices include: Mini-LED and micro-LED.

In some implementations, a quantum dot film layer is provided on a side of the transparent substrate facing away from the electrode layer.

In some implementations, a reflective layer is provided between the transparent substrate and the quantum dot film layer, and a side of the reflective layer facing away from the transparent substrate is a reflective surface.

In some implementations, an orthographic projection of the reflective layer on the transparent substrate does not overlap with an orthographic projection of the micro-display light emitting devices on the transparent substrate, In some implementations, the driving module includes: a driver chip and a flexible circuit board, the flexible circuit board includes a plurality of conductive lines, first ends of the conductive lines are coupled to the driver chip, and second ends of the conductive lines are electrically coupled to the signal transmission lines.

In a second aspect, the present disclosure provides a display substrate including the backplane of the first aspect of the present disclosure.

In a third aspect, the present disclosure provides a display device including the display substrate of the second aspect of the present disclosure.

Figure 1:
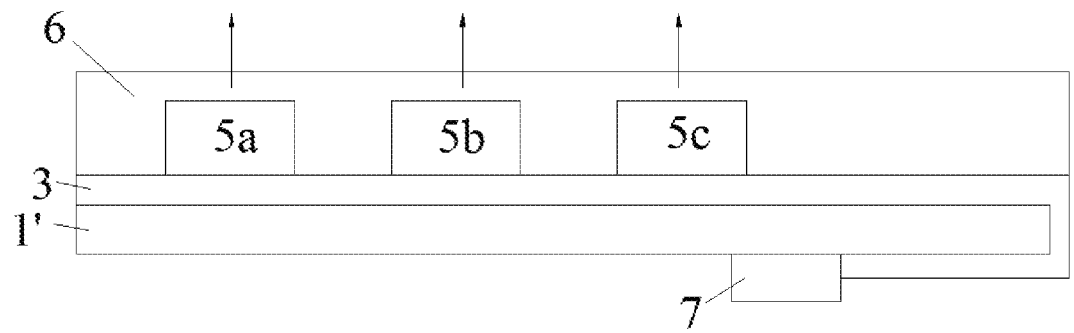
FIG. 1 is a schematic structural diagram of a micro-LED display device according to the related art.

Reference signs: 1', rigid substrate; 1, transparent substrate; 1A, active area; 1B, edge area; 2, first insulating layer; 3, electrode layer; 31, first sub-signal line; 32, second sub-signal line; 3a, connecting electrode; 4, second insulating layer; 5a, first micro-display light emitting device; 5b, second micro-display light emitting device; 5c, third micro-display light emitting device; 51, cathode; 52, anode; 6, protective layer; 7, flexible circuit board; 8, rigid circuit board; 9, driver chip; 10, hole filling adhesive; 11a, first light conversion material; 11b, second light conversion material; 12, reflective layer; 13, quantum clot film layer; H, via hole.

DESCRIPTION OF EMBODIMENTS

In order to enable those skilled in the art to better understand technical solutions of the present disclosure, a backplane, a display substrate, and a display device provided in the present disclosure are described in detail below with reference to the accompanying drawings.

Example embodiments will be described more fully hereinafter with reference to the accompanying drawings, but they may be embodied in different forms and the present disclosure should not be construed as limited to the embodiments set forth herein. Rather, these embodiments are provided so that the present disclosure will be thorough and complete, and will fully convey the scope of the present disclosure to those skilled in the art.

Terminologies used in the present disclosure are for a purpose of describing particular embodiments only and are not intended to limit the present disclosure. As used herein, the singular forms "a", "an" and "the" are intended to include the plural forms as well, unless the context clearly indicates otherwise. It will be further understood that the terms "include" and/or "comprise" or their variants when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements/components/structures, these elements/components/structures should not be limited by these terms. These terms are only used to distinguish one element/component/structure from another element/component/structure.

Unless otherwise defined, all terms (including technical and scientific terms) used herein have the same meanings as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used in the present disclosure, the "patterning process" refers to a step of forming a structure having a specific pattern, which may be a photolithography process including one or more steps of forming a material layer, coating a photoresist, exposing, developing, etching, stripping the photoresist, and the like; certainly, the "patterning process" may also be an imprinting process, an inkjet printing process, or any other process.

Reference in the present disclosure to two structures being electrically coupled means that an electrical current can be transmitted between the two structures. Reference in the present disclosure to two structures being coupled means that the two structures are in contact and capable of transmitting an electric current therebetween.

Referring to , in the related art, a micro light emitting diode display device includes a rigid substrate 1' (made of a material such as glass), an electrode layer 3 provided on the rigid substrate 1', a plurality of micro light emitting diodes (denoted as a first micro-display light emitting device 5a, a second micro-display light emitting device 5b, and a third micro-display light emitting device 5c) bound to a side of the electrode layer 3 facing away from the rigid substrate 1', a protective adhesive 6 covering the micro light emitting diodes, and a flexible circuit board 7. A driver chip (not shown) and the like may be provided on the flexible circuit board 7. The micro light emitting diodes are provided on a first side of a plane where the rigid substrate 1' is located, the flexible circuit board 7 is provided on a second side of the plane where the rigid substrate 1' is located, and the first side and the second side of the plane where the rigid substrate 1' is located are opposite to each other. In order to electrically couple the flexible circuit board 7 to the micro light emitting diodes, wiring is required on a side surface of the rigid substrate 1'. The process of wiring on the side surface of the rigid substrate 1' is difficult and a complex and expensive equipment is required.

Referring to FIGS. 2a to 8, an embodiment of the present disclosure provides a backplane including: a transparent substrate 1; an electrode layer 3 provided at a side of the transparent substrate 1 and including a plurality of signal transmission lines; a plurality of micro-display light emitting devices provided on a side, facing away from the transparent substrate 1, of the electrode layer 3, electrically coupled to the signal transmission lines, and capable of emitting light towards the transparent substrate 1; a protective layer 6 provided on a side of the micro-display light emitting devices facing away from the transparent substrate 1; and a driving module provided on a side, facing away from the transparent substrate 1, of the protective layer 6, and electrically coupled to the signal transmission lines.

The transparent substrate 1 is, for example, a glass substrate.

The micro-display light emitting devices refer to light emitting devices of small size, for example Micro-LEDs (each typically having an overall size below 100 μm) or Mini-LEDs (each typically having an overall size between 100 μm and 200 μm), The protective layer 6 electrically and mechanically protects the micro-display light emitting devices, and a material of the protective layer 6 is, for example, silicon adhesive, epoxy adhesive, or the like, and may be formed through a dispensing process or an injection molding process.

The driving module includes, for example, a driver chip 9, a rigid circuit board 8 and a flexible circuit board 7, the driver chip 9 is bound on the rigid circuit board 8 to transmit a driving signal to the rigid circuit board 8; the flexible circuit board 7 is further bound on the rigid circuit board 8 to transmit a driving signal from the rigid circuit board 8 to the flexible circuit board 7; and the flexible circuit board 7 is electrically coupled to the electrode layer 3, thereby transmitting a driving signal from the flexible circuit board 7 to the electrode layer 3; the micro-display light emitting devices are finally driven to emit light by the electrode layer 3.

In some implementations, the driving module may include: the driver chip 9 and the flexible circuit board 7, the flexible circuit board 7 includes a plurality of conductive lines (not shown), first ends of the conductive lines are coupled to the driver chip 9, and second ends of the conductive lines are electrically coupled to the signal transmission lines (i.e., the electrode layer 3).

Figure 2A:
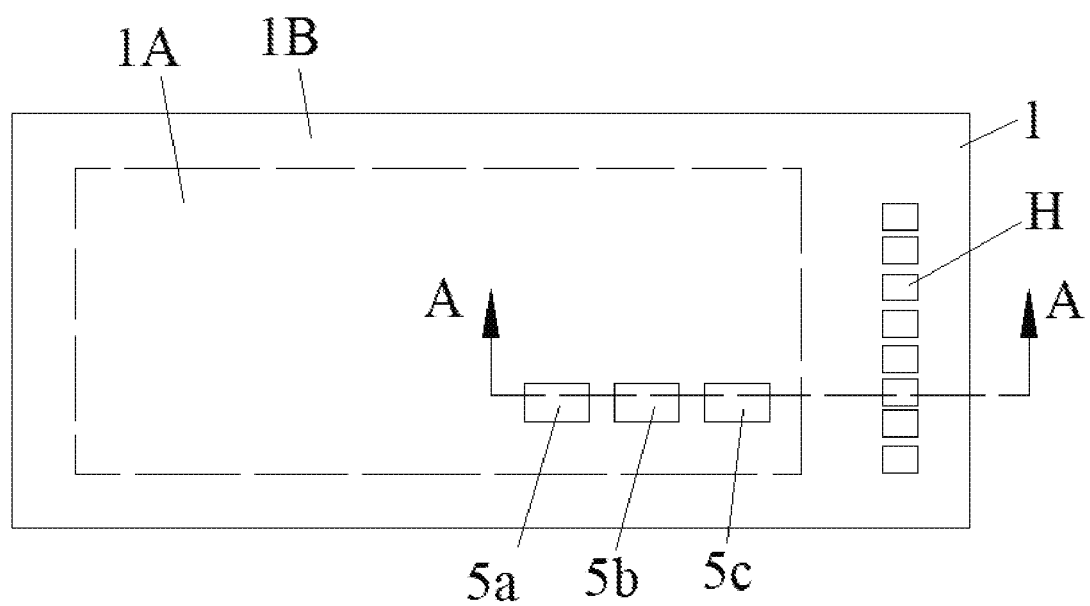
FIG. 2a is a front view of a backplane according to an embodiment of the present disclosure.
Figure 2B:
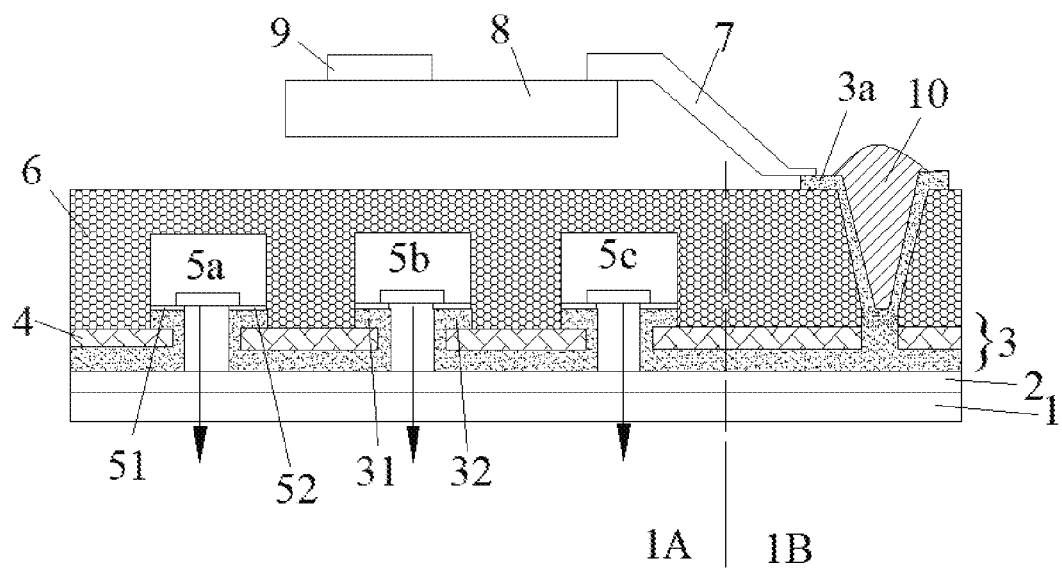
FIG. 2b is a cross-sectional view of the backplane shown in FIG. 2 taken along line AA in some embodiments of the present disclosure.

For example, referring to FIG. 2*b*, the driver chip 9 is directly bound on the flexible circuit board 7, instead of electrically coupling the driver chip 9 with the flexible circuit board 7 via the rigid circuit board 8. That is, the above-mentioned rigid circuit board 8 is an optional component in the driving module.

In the backplane provided by the embodiment of the present disclosure, the micro-display light emitting devices and the driving module are provided on a single side of a plane where the transparent substrate 1 is located, and accordingly, a structure for forming electrical coupling between the micro-display light emitting devices and the driving module is provided on the single side of the plane where the transparent substrate 1 is located, so that it is not necessary to perform wiring on the side surface of the transparent substrate 1, resulting in a simple manufacturing process of the backplane and a reduced cost.

A first insulating layer 2, for example a Polyimide (PI) layer or a transparent Thermoplastic Polyimide (TPI) layer, may be further provided between the transparent substrate 1 and the electrode layer 3.

A single layer of signal transmission lines or multiple layers of signal transmission lines may be provided in the electrode layer 3, and referring to FIG. 2*b*, two layers of signal transmission lines are provided in the electrode layer 3, the two layers of signal transmission lines are separated by a second insulating layer 4, and a material of the second insulating layer 4 is, for example, Polyimide (PI) or transparent Thermoplastic Polyimide (TPI).

In some implementations, an opening is formed in an area of the electrode layer 3 facing the micro-display light emitting devices in a direction perpendicular to the transparent substrate 1. Since the micro-display light emitting devices emit light toward the transparent substrate 1, the opening formed in the electrode layer 3 is advantageous to improve transmittance of the backplane.

Referring to FIG. 2*b*, a pattern of a first layer of signal transmission lines may be formed on the first insulating layer 2 through a patterning process, and the material of the first layer of signal transmission lines corresponding to an area where the opening is to be formed is removed.

A pattern of the second insulating layer 4 is then formed on the first layer of signal transmission lines through a patterning process, while the material of the second insulating layer 4 corresponding to the area where the opening is to be formed is retained (removed in a subsequent process), leaving a gap between the material of the second insulating layer 4 to be removed and the second insulating layer 4 in the final product.

Then, a conductive material for forming a second layer of signal transmission lines is deposited, the conductive material would fill the gap, and a pattern of the second layer of signal transmission lines may be formed by processes of exposure, development and etching, and, the conductive material in the area where the opening is to be formed is removed.

Finally, the residual material of the second insulating layer 4 in the area where the opening is to be formed is removed.

Referring to FIGS. 2*a* to 4, in some implementations, the backplane is divided into an active area IA and an edge area 1B surrounding the active area 1A; a via hole H communicated with the signal transmission lines is formed in a part, located in the edge area 1B, of the protective layer 6, a connecting electrode :3*a* is provided in the via hole H, the connecting electrode 3*a* extends to a side, facing away from the transparent substrate 1, of the protective layer 6, and the driving module is coupled to the signal transmission lines through the connecting electrode 3*a*.

A plurality of micro-display light emitting devices are provided, for example, in an array, in the active area (also called as AA area) 1A; the connecting electrode 3*a* is used as an interface for communicating the electrode layer 3 with outside; the flexible circuit board 7 in the driving module is coupled to the connecting electrode 3*a* on a surface of the protective layer 6 facing away from the transparent substrate 1.

Figure 3:
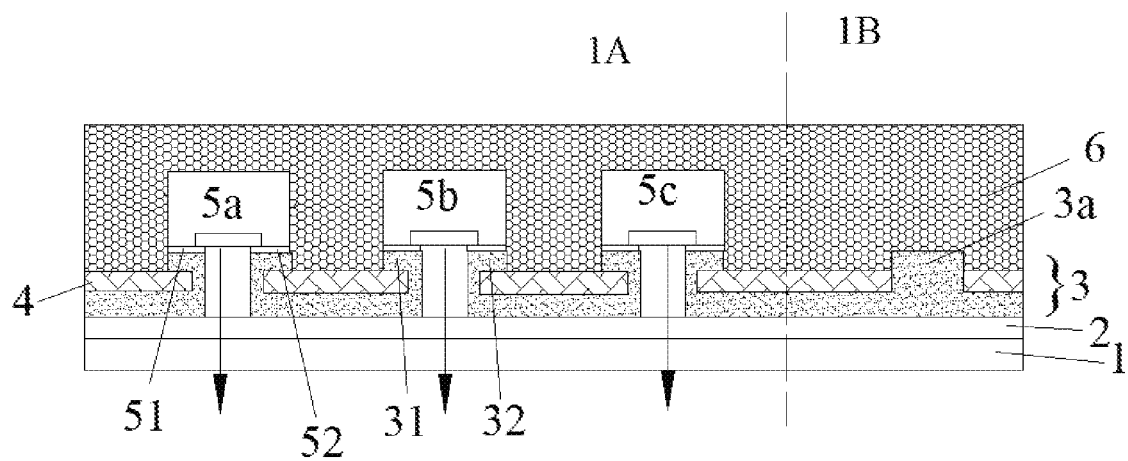
FIG. 3 is a schematic structural view of the backplane shown in FIG. 2b in a first stage of manufacturing.

Referring to FIG. 3, first, a conductive layer is formed on the transparent substrate 1 (specifically, on the first insulating layer 2), for example, the signal transmission lines in the electrode layer 3 may be formed by using a sputtering, a photolithography, or an electroplating process, a connecting electrode 3*a* is formed in the edge area 1B; then the micro-display light emitting devices are bound on the conductive layer; subsequently, the protective layer 6 is formed, and the protective layer 6 covers the connecting electrode 3*a*.

The micro-display light emitting devices may be bound to the conductive layer by means of soldering, eutectic bonding, or the like.

Figure 4:
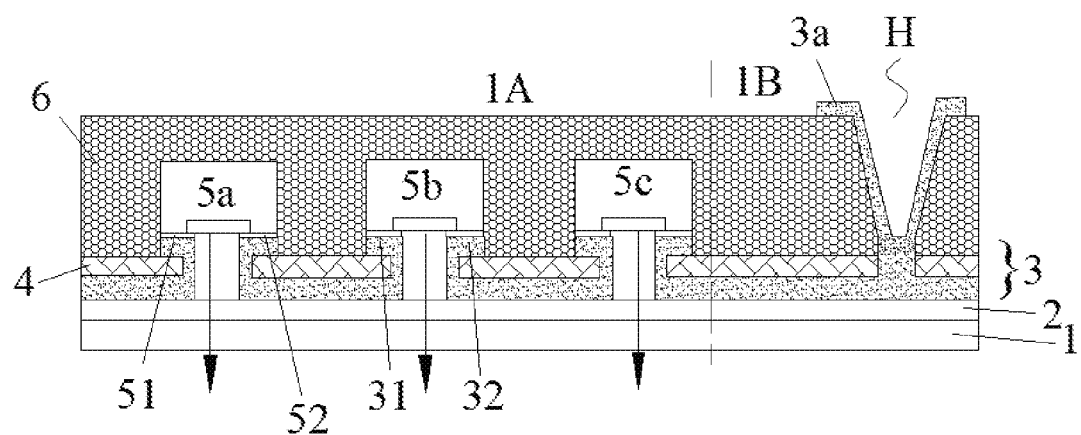
FIG. 4 is a schematic structural view of the backplane shown in FIG. 2b in a second stage of manufacturing.

Referring to FIG. 4, after the protective layer 6 is formed, a via hole H is formed in the protective layer 6 to expose the connecting electrode 3*a*; the connecting electrode 3*a* at a bottom of the via hole H is then extended outside the via hole H by using a patterning process.

Referring to FIG. 2*b*, after the connecting electrode 3*a* is extended outside the via hole H, the flexible circuit board 7 is bound with the connecting electrode 3*a*.

Referring to FIG. 2*b*, in some implementations, a hole filling adhesive 10 is provided in the via hole H and on a side of the connecting electrode 3*a* facing away from the transparent substrate 1.

A material of the hole filling adhesive 10 is, for example, silicon adhesive, epoxy resin, ultraviolet curing adhesive, acrylic acid, etc., so as to protect the part in the via hole H.

Figure 5:
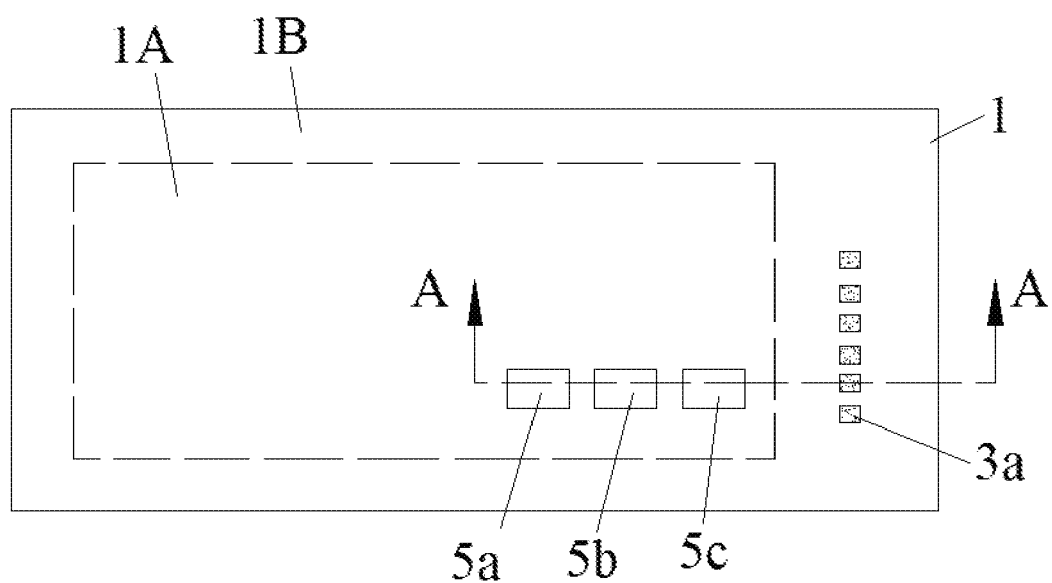
FIG. 5 is a front view of a backplane according to some embodiments of the present disclosure.
Figure 6:
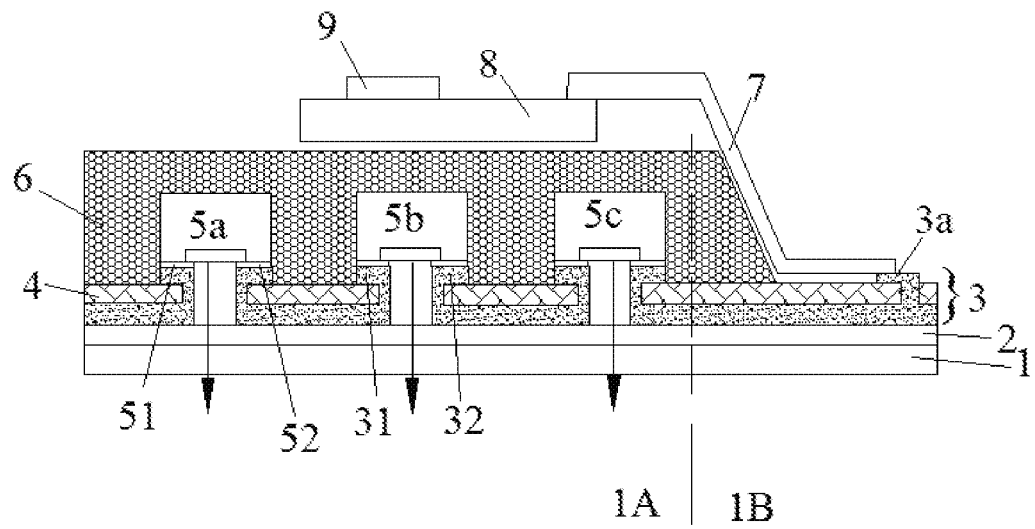
FIG. 6 is a cross-sectional view of the backplane shown in FIG. 5 taken along line BB.

Referring to FIGS. 5 and 6, in some implementations, the backplane is divided into the active area 1A and the edge area 1B surrounding the active area 1A; a part of the protective layer 6 in the edge area 1B covers a part of the edge area 1B proximal to the active area 1A, and a part of the signal transmission lines in the edge area 1B and not covered by the protective layer 6 are coupled to the driving module.

Thus, during manufacturing the backplane, after the protective layer 6 is formed, an outer part of the backplane in the edge area 1B exposes an area of the electrode layer 3, so as to couple (or bind) the flexible circuit board 7 at an exposed part of the electrode layer 3.

Referring to FIG. 6, in some implementations, a side surface, facing away from the active area, of the part of the protective layer 6 in the edge area 1B is a slope surface.

A whole layer of material of the protective layer 6 may be first formed on the transparent substrate 1, and then a piece of material of the protective layer 6 in the edge area 1B proximal to a peripheral boundary thereof may be removed by using a patterning process such as photolithography, and the protective layer 6 may be formed with a relatively gentle slope in a middle of the edge area 1B by controlling parameters of an etching process.

In such way, when binding the flexible circuit board 7, the flexible circuit board 7 cannot he bent significantly, and thus it is convenient for improving the product yield and reducing the difficulty of binding.

Referring to FIGS. 2b, 6 to 8, in some implementations, the signal transmission lines includes a first sub-signal line 31 and a second sub-signal line 32, the first sub-signal line 31 is coupled to one of a cathode 51 and a anode 52, and the second sub-signal line 32 is coupled to the other of the cathode 51 and the anode 52.

That is, the micro-display light emitting devices may be bound to the signal transmission lines.

In some implementations, the electrode layer 3 further includes a binding electrode (not shown) coupled to the signal transmission lines, the binding electrode includes a first sub-electrode and a second sub-electrode, each of the micro-display light emitting devices includes the cathode 51 and the anode 52, the first sub-electrode is coupled to one of the cathode 51 and the anode 52, and the second sub-electrode is coupled to the other of the cathode 51 and the anode 52.

Certainly, the micro-display light emitting devices may also be bound on the binding electrode, and the binding electrode is formed by a part of conductive material coupled to the signal transmission lines.

The above are all for realizing an electrical coupling between the micro-display light emitting devices and the electrode layer 3, and the specific coupling mode is not limited thereto.

Figure 7:
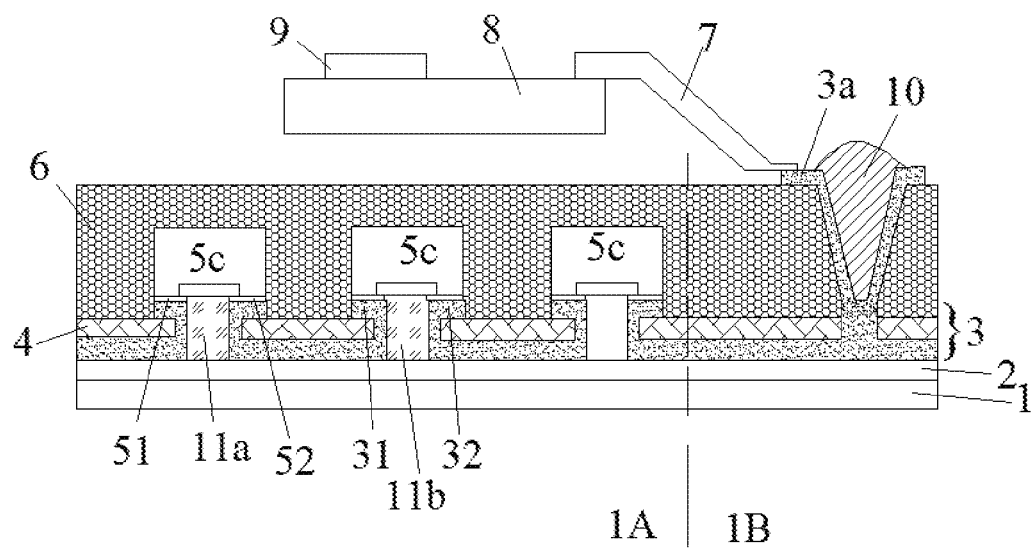
FIG. 7 is a cross-sectional vies of the backplane shown in FIG. 2a taken along line AA in some embodiments of the present disclosure.

Referring to FIGS. 2b, 6 and 7, in some implementations, all of the micro-display light emitting devices constitute a plurality of pixels, each of the pixels includes at least three of the micro-display light emitting devices.

Thus, the backplane can be used as a part of a display substrate. Referring to FIGS. 2b and 6, in some implementations, the pixels include: a first micro-display light emitting device 5a configured to emit red light; a second micro-display light emitting device 5b configured to emit green light; and a third micro-display light emitting device 5c configured to emit blue light.

That is, each of the micro-display light emitting devices corresponds to a sub-pixel for one color.

Referring to FIG. 7, in some implementations, the pixels include: a first micro-display light emitting device 5a configured to emit a predetermined color light, a first light conversion material 11a being formed in an opening between the first micro-display light emitting device 5a and the transparent substrate 1; a second micro-display light emitting device 5b configured to emit the predetermined color light, a second light conversion material 11b being formed in an opening between the second micro-display light emitting device 5b and the transparent substrate 1; a third micro-display light emitting device 5c configured to emit the predetermined color light; the first light conversion material 11a is configured to convert the predetermined color light into a first color light, and the second light conversion material 11b is configured to convert the predetermined color light into a second color light.

The micro-display light emitting devices all emit light of a single color, that is, electrical characteristics of the micro-display light emitting devices in the sub-pixels with different colors are the same, resulting in a simpler design of the driving module for driving the micro-display light emitting devices.

Down-conversion luminescent material may be selected as the first light conversion material 11a and the second light conversion material 11b. Down-conversion luminescent material refers to material capable of emitting two or more low energy photons after absorbing ultraviolet light of one high energy photon, which results in a relative high luminescent efficiency.

In some implementations, the predetermined color light is blue light, the first color light is red light, and the second color light is green light.

That is, the first light conversion material 11a converts blue light into red light, and the second light conversion material 11b converts blue light into green light.

In some implementations, the first light conversion material 11a includes red fluorescent adhesive; the second light conversion material 11b includes green fluorescent adhesive.

The fluorescent adhesive is adhesive material containing fluorescent powder, for example, the red fluorescent adhesive can convert blue light into red light, and the green fluorescent adhesive can convert blue light into green light. Openings where the first light conversion material 11a and the second light conversion material 11b are formed are relatively small, and these openings can be well filled with the fluorescent adhesive.

Figure 8:
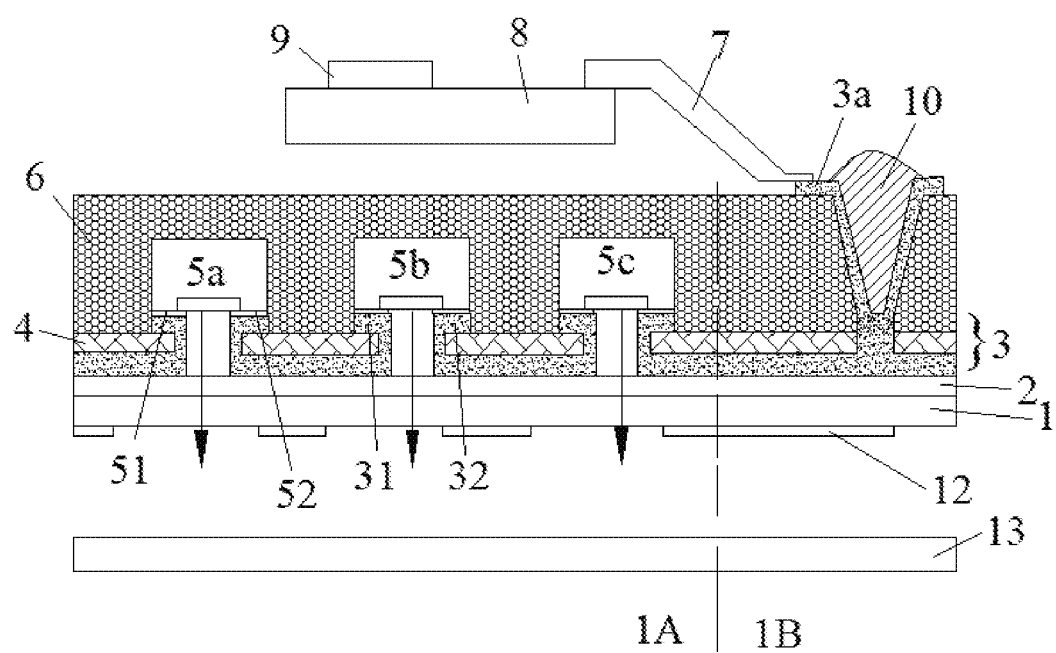
FIG. 8 is a cross-sectional view of the backplane shown in FIG. 2a taken along line AA in some embodiments of the present disclosure.

Referring to FIG. 8, in some implementations, a quantum dot film layer 13 is provided on a side of the transparent substrate 1 facing away from the electrode layer 3.

Quantum dots, for example, a semiconductor material formed by combining zinc, cadmium, selenium, and sulfur atoms, and having a crystal structure which has dimensions in the order of nanometers in three dimensions, are distributed in the quantum dot film layer 13. For the quantum dots, an energy level is changed according to the dimensions of the quantum dots, and thus a band gap can be controlled by changing the dimensions of the quantum dots, thereby controlling an emission spectrum of the quantum dots. That is, the quantum dots can convert one color light into another color light, and for example, if the quantum dot film layer 13 includes crystalline structures of different dimensions, it can emit a composite color light, e.g., can covert blue light to white light. In the related art, the quantum dot film layer 13 can be made into a film layer with a relative large size, so that the quantum dot film layer 13 can be used for converting light in a large area.

In these embodiments, the backplane is applied as a surface light source. For example, it can be used as a backlight in a liquid crystal display.

In the related art, the backlight mostly adopts a structure in which Mini-LEDs are provided on a rigid circuit board, and compared with the backlight in the related art, the backplane as above applied as the backlight has advantages that a thinner line width can be realized, a more number of areas can be realized, and a finer control on the backlight can be realized.

In some implementations, a reflective layer 12 is provided between the transparent substrate 1 and the quantum dot film layer 13, and a side of the reflective layer 12 facing away from the transparent substrate 1 is a reflective surface.

The reflective layer 12 enables the light emitted by the quantum dot film layer 13 in different directions to be emitted towards a direction far away from the transparent substrate 1, so that a utilization rate of the light is improved.

In some implementations, an orthographic projection of the reflective layer 12 on the transparent substrate 1 does not overlap with an orthographic projection of the micro-display light emitting devices on the transparent substrate 1.

With such configurations, the light emitted by the micro-display light emitting devices in a path to the quantum dot film layer 13 would riot impaired by the reflective layer, resulting in a further improved utilization rate of the light.

An embodiment of the present disclosure further provides a display substrate, including the backplane provided by the previous embodiment.

An embodiment of the present disclosure further provides a display device, including the display substrate provided by the foregoing embodiment.

It will be understood that the above embodiments are merely exemplary embodiments employed to illustrate principles of the present disclosure, and the present disclosure is not limited thereto. It will be apparent to those skilled in the art that various changes and modifications can be made therein without departing from the spirit and scope of the present disclosure, and these changes and modifications are to be considered within the scope of the present disclosure.

The invention claimed is:

1. A backplane, comprising:
a transparent substrate;
an electrode layer provided on a side of the transparent substrate and comprising a plurality of signal transmission lines;
a plurality of micro-display light emitting devices provided on a side, facing away from the transparent substrate, of the electrode layer, electrically coupled to the signal transmission lines, and capable of emitting light towards the transparent substrate;
a protective layer provided on a side, facing away from the transparent substrate, of the micro-display light emitting devices; and
a driving module provided on a side, facing away from the transparent substrate, of the protective layer, and electrically coupled to the signal transmission lines,
wherein the backplane further comprises a second insulating layer, the electrode layer comprises a first part between the second insulating layer and the transparent substrate, and a second part on a side of the second insulating layer away from the transparent substrate, the first part and the second part of the electrode layer are electrically coupled through a via hole penetrating through the second insulating layer,
the micro-display light emitting devices comprise at least one of Mini-LEDs and Micro-LEDs, and the micro-display light emitting devices are electrically coupled to the second part of the electrode layer,
the backplane further comprises a connecting electrode, the driving module is electrically coupled to the signal transmission lines through the connecting electrode, and the connecting electrode comprises at least part of the second part of the electrode layer,
wherein the driving module comprises: a driver chip and a flexible circuit board, and the flexible circuit board comprises a plurality of conductive lines, first ends of the conductive lines are coupled to the driver chip, and second ends of the conductive lines are electrically coupled to the signal transmission lines.

2. The backplane of claim 1, wherein the backplane is divided into an active area and an edge area surrounding the active area;
a part of the protective layer in the edge area is provided with a via hole communicated to the signal transmission lines, the connecting electrode is provided in the via hole, the connecting electrode extends to a side, facing away from the transparent substrate, of the protective layer, and the driving module is coupled to the signal transmission lines through the connecting electrode.

3. The backplane of claim 2, wherein a hole filling adhesive is provided in the via hole on a side of the connecting electrode facing away from the transparent substrate.

4. The backplane of claim 1, wherein the backplane is divided into an active area and an edge area surrounding the active area;
a part of the protective layer in the edge area covers a part, proximal to the active area, of the edge area, and a part of the signal transmission lines in the edge area and not covered by the protective layer are coupled to the driving module and comprises at least part of the connecting electrode.

5. The backplane of claim 4, wherein a side surface, facing away from the active area, of the part of the protective layer in the edge area is a slope surface.

6. The backplane of claim 1, wherein the electrode layer further comprises a binding electrode coupled to the signal transmission lines, the binding electrode comprises a first sub-electrode and a second sub-electrode, each of the micro-display light emitting devices comprises a cathode and an anode, the first sub-electrode is connected to one of the cathode and the anode, and the second sub-electrode is connected to the other of the cathode and the anode.

7. The backplane of claim 6, wherein the signal transmission lines comprise a first sub-signal line and a second sub-signal line, the first sub-signal line is coupled to one of the cathode and the anode, and the second sub-signal line is coupled to the other of the cathode and the anode.

8. The backplane of claim 1, wherein a reflective layer is provided on a side of the transparent substrate facing away from the electrode layer, and an orthographic projection of the reflective layer on the transparent substrate does not overlap with an orthographic projection of the micro-display light emitting devices on the transparent substrate.

9. The backplane of claim 1, wherein an opening is formed in an area of the electrode layer facing the micro-display light emitting devices in a direction perpendicular to the transparent substrate.

10. The backplane of claim 9, wherein all of the micro-display light emitting devices constitute a plurality of pixels, each of the pixels comprises at least three of the micro-display light emitting devices.

11. The backplane of claim 10, wherein each of the pixels comprises:
   a first micro-display light emitting device configured to emit red light;
   a second micro-display light emitting device configured to emit green light; and
   a third micro-display light emitting device configured to emit blue light.

12. The backplane of claim 10, wherein each of the pixels comprises:
   a first micro-display light emitting device configured to emit a predetermined color light, a first light conversion material being formed in an opening between the first micro-display light emitting device and the transparent substrate;
   a second micro-display light emitting device configured to emit the predetermined color light, a second light conversion material being formed in an opening between the second micro-display light emitting device and the transparent substrate;
   a third micro-display light emitting device configured to emit the predetermined color light;
   the first light conversion material is configured to convert the predetermined color light into a first color light, and the second light conversion material is configured to convert the predetermined color light into a second color light.

13. The backplane of claim 12, wherein the predetermined color light is blue light, the first color light is red light, and the second color light is green light.

14. The backplane of claim 13 wherein the first light conversion material comprises red fluorescent adhesive;
   the second light conversion material includes green fluorescent adhesive.

15. The backplane of claim 1, wherein a quantum dot film layer is provided on a side of the transparent substrate facing away from the electrode layer, and a reflective layer is provided between the transparent substrate and the quantum dot film layer, and a side of the reflective layer facing away from the transparent substrate is a reflective surface.

16. The backplane of claim 2, wherein the connecting electrode comprises a first connecting sub-electrode and a second connecting sub-electrode, the first connecting sub-electrode is a part of the second part of the electrode layer, and the second connecting sub-electrode is on a side of the first connecting sub-electrode away from the transparent substrate.

17. The backplane of claim 4, wherein the part of the signal transmission lines in the edge area and not covered by the protective layer comprises a part of the second part of the electrode layer electrically coupled to the driving module.

18. The backplane of claim 1, wherein a material of the second insulating layer is Polyimide (PI) or transparent Thermoplastic Polyimide (TPI).

19. A backplane, comprising:
   a transparent substrate;
   an electrode layer provided on a side of the transparent substrate and comprising a plurality of signal transmission lines;
   a plurality of micro-display light emitting devices provided on a side, facing away from the transparent substrate, of the electrode layer, electrically coupled to the signal transmission lines, and capable of emitting light towards the transparent substrate;
   a protective layer provided on a side, facing away from the transparent substrate, of the micro-display light emitting devices; and
   a driving module provided on a side, facing away from the transparent substrate, of the protective layer, and electrically coupled to the signal transmission lines,
   wherein the micro-display light emitting devices comprise Mini-LEDs and Micro-LEDs, a quantum dot film layer is provided on a side of the transparent substrate facing away from the electrode layer, a reflective layer is provided between the transparent substrate and the quantum dot film layer, and a side of the reflective layer facing away from the transparent substrate is a reflective surface,
   wherein openings are formed in areas of the electrode layer facing the micro-display light emitting devices in a direction perpendicular to the transparent substrate, and
   wherein all of the micro-display light emitting devices constitute a plurality of pixels, each of the pixels comprises a first micro-display light emitting device, a second micro-display light emitting device and a third micro-display light emitting device, each of the first micro-display light emitting device, the second micro-display light emitting device and the third micro-display light emitting device emits a predetermined color light,
   a first light conversion material is formed in the opening of the electrode layer between the first micro-display light emitting device and the transparent substrate,
   a second light conversion material is formed in the opening of the electrode layer between the second micro-display light emitting device and the transparent substrate,
   the first light conversion material is configured to convert the predetermined color light into a first color light, and the second light conversion material is configured to convert the predetermined color light into a second color light.

20. A backplane, comprising:
   a transparent substrate;
   an electrode layer provided on a side of the transparent substrate and comprising a plurality of signal transmission lines;
   a plurality of micro-display light emitting devices provided on a side, facing away from the transparent substrate, of the electrode layer, electrically coupled to the signal transmission lines, and capable of emitting light towards the transparent substrate;
   a protective layer provided on a side, facing away from the transparent substrate, of the micro-display light emitting devices; and
   a driving module provided on a side, facing away from the transparent substrate, of the protective layer, and electrically coupled to the signal transmission lines,
   wherein the backplane further comprises a second insulating layer, the electrode layer comprises a first part between the second insulating layer and the transparent substrate, and a second part on a side of the second insulating layer away from the transparent substrate, the first part and the second part of the electrode layer are electrically coupled through a via hole penetrating through the second insulating layer,
   the micro-display light emitting devices comprise at least one of Mini-LEDs and Micro-LEDs, and the micro-display light emitting devices are electrically coupled to the second part of the electrode layer,
   the backplane further comprises a connecting electrode, the driving module is electrically coupled to the signal transmission lines through the connecting electrode, and the connecting electrode comprises at least part of the second part of the electrode layer, wherein the backplane is divided into an active area and an edge area surrounding the active area;

a part of the protective layer in the edge area is provided with a via hole communicated to the signal transmission lines, the connecting electrode is provided in the via hole, the connecting electrode extends to a side, facing away from the transparent substrate, of the protective layer, and the driving module is coupled to the signal transmission lines through the connecting electrode, wherein the connecting electrode comprises a first connecting sub-electrode and a second connecting sub-electrode, the first connecting sub-electrode is a part of the second part of the electrode layer, and the second connecting sub-electrode is on a side of the first connecting sub-electrode away from the transparent substrate.

* * * * *